US010078266B2

(12) United States Patent
Liou et al.

(10) Patent No.: US 10,078,266 B2
(45) Date of Patent: Sep. 18, 2018

(54) IMPLANTED PHOTORESIST STRIPPING PROCESS

(71) Applicant: Mattson Technology, Inc., Fremont, CA (US)

(72) Inventors: Wei-Hua Liou, Hsinchu (TW); Chun-Yen Kang, Tainan (TW); Vijay M. Vaniapura, Tracy, CA (US); Hai-Au M. Phan-Vu, San Jose, CA (US); Shawming Ma, Sunnyvale, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 15/441,332

(22) Filed: Feb. 24, 2017

(65) Prior Publication Data

US 2017/0248849 A1    Aug. 31, 2017

Related U.S. Application Data

(60) Provisional application No. 62/302,485, filed on Mar. 2, 2016, provisional application No. 62/300,370, filed on Feb. 26, 2016.

(51) Int. Cl.
   *G03F 7/42* (2006.01)
   *H01L 21/66* (2006.01)
   *H01L 21/311* (2006.01)

(52) U.S. Cl.
   CPC .......... *G03F 7/42* (2013.01); *H01L 21/31133* (2013.01); *H01L 21/31138* (2013.01); *H01L 22/24* (2013.01); *H01J 2237/3342* (2013.01)

(58) Field of Classification Search
   CPC ... G03F 7/26; G03F 7/427; G03F 7/42; H01L 21/31133; H01L 21/31138; H01L 22/24
   See application file for complete search history.

(56) References Cited

U.S. PATENT DOCUMENTS

| 7,799,685 B2 | 9/2010 | Savas et al. |
| 7,947,605 B2 | 5/2011 | George et al. |
| 8,093,157 B2 | 1/2012 | Diao et al. |

(Continued)

FOREIGN PATENT DOCUMENTS

KR    10-2005-0110540    11/2005

OTHER PUBLICATIONS

PCT International Search Report for corresponding PCT Application No. PCT/US2017/019265, dated May 30, 2017, 3 pages.

*Primary Examiner* — Duy Vu N Deo
(74) *Attorney, Agent, or Firm* — Dority & Manning, P.A.

(57) ABSTRACT

Processes for removing a photoresist from a substrate after, for instance, ion implantation are provided. In one example implementation, a process can include placing a substrate having a bulk photoresist and a crust formed on the bulk photoresist in a processing chamber. The process can include initiating a first strip process in the processing chamber. The process can include accessing an optical emission signal associated with a plasma during the first strip process. The process can include identifying an endpoint for the first strip process based at least in part on the optical emission signal. The process can include terminating the first strip process based at least in part on the endpoint. The process can include initiating a second strip process to remove the photoresist from the substrate.

14 Claims, 5 Drawing Sheets

(56) References Cited

U.S. PATENT DOCUMENTS

| | | | |
|---|---|---|---|
| 2004/0195208 A1* | 10/2004 | Pavel | H01J 37/32935 216/59 |
| 2005/0079717 A1* | 4/2005 | Savas | F16B 33/02 438/689 |
| 2007/0264841 A1 | 11/2007 | Chebi et al. | |
| 2012/0052687 A1 | 3/2012 | Raghavan et al. | |

* cited by examiner

IMPLANTED PHOTORESIST STRIPPING PROCESS

PRIORITY CLAIM

The present application claims the benefit of priority of U.S. application Ser. No. 62/300,370, filed Feb. 26, 2016, titled "Implanted Photoresist Stripping Process By Layers Using Inductively Coupled Strippers." The present application claims the benefit of priority of U.S. application Ser. No. 62/302,485, filed Mar. 2, 2016, titled "Implanted Photoresist Stripping Process," which is incorporated herein by reference.

FIELD

The present disclosure relates generally to semiconductor fabrication and more particularly to a process for removal of photoresist and residues in semiconductor processing.

BACKGROUND

Plasma processing is widely used in the semiconductor industry for deposition, etching, resist removal, and related processing of semiconductor wafers and other substrates. Plasma processing equipment can be used, for instance, in photoresist stripping applications in integrated circuit fabrication. Photoresist applications following ion implantation for advanced nodes (e.g., nodes of 20 mm or less) can pose challenges. For instance, a hardened "crust" can be formed on a photoresist which has received most of the ion dose during implantation. The remaining photoresist which has not been implanted (e.g., the "bulk" photoresist) can be partially or completely enveloped by the crust.

It can be desirable to cleanly remove the photoresist after ion implantation before the substrate goes to thermal annealing for dopant activation so that there is no residue as residue can lead to a drop in yield. In some instances, this can be accomplished by: (1) plasma strip followed by wet clean; (2) plasma strip only; or (3) wet strip only.

Resist ash strip processes in a plasma stripper can be isotropic processes. A resist ash strip process can remove the crust at the bottom of the photoresist, and can then remove the bulk photoresist. If photoresist is completely removed using a plasma strip process, some residue may not be cleaned by a following wet strip due to the residue hardening during the plasma strip. As a result, for advanced nodes (e.g., 20/16 nm nodes), many manufacturers have switched to wet strip only for use in post ion implantation resist strip. Use of wet strip only can reduce oxidation. However, if the photoresist is removed by wet strip only, a more aggressive chemistry may be needed to remove a crust layer formed during ion implantation. This can attack the substrate and induce defects.

SUMMARY

Aspects and advantages of embodiments of the present disclosure will be set forth in part in the following description, or may be learned from the description, or may be learned through practice of the embodiments.

One example aspect of the present disclosure is directed to a strip process for removal of photoresist from a substrate. The process includes placing a substrate having a bulk photoresist and a crust formed on the bulk photoresist in a processing chamber. The process includes initiating a first strip process in the processing chamber. The process includes accessing an optical emission signal associated with a plasma during the first strip process. The process includes identifying an endpoint associated with removal of at least a portion of the crust based at least in part on the optical emission signal. The process includes terminating the first strip process based at least in part on the endpoint. The process includes initiating a second strip process to remove the photoresist from the substrate.

Variations and modifications can be made to this example embodiment of the present disclosure. Other example aspects are directed to systems, methods, processes, and apparatus for removing a photoresist from a substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to stripping processes for removal of photoresist from a substrate. For instance, the process can be used as part of the removal of different layers individually from horizontal and/or vertical direction for low dose implant strip (LDIS)/high dose implant strip (HDIS). In some implementations, a plasma strip process can be combined with a wet strip process (e.g., a wet clean process) to satisfy a wider range of process requirements relating to reduced oxide formation, reduced substrate loss, and surface clean requirements to improve yield. More particularly, in some embodiments, a plasma strip process can be used for crust removal and a wet strip process can be used to remove the bulk photoresist. The strip processes according to example aspects of the present disclosure can be used for advanced nodes (e.g., below 16 nm nodes) in integrated circuit fabrication. This can allow different integration schemes to use different dry strip and wet strip combinations to enlarge the strip process window.

More particularly, according to example embodiments of the present disclosure, a plasma strip process can be used for crust removal. An optical emission signal associated with a plasma induced during the plasma strip process can be used to determine an endpoint for the plasma strip process. The endpoint in the optical emission signal can be indicative of the removal of the crust or, in some cases, the removal of the top portion of the crust from the bulk photoresist. Once the endpoint has been achieved, a wet strip process can be used to remove the bulk photoresist.

In this way, aspects of the present disclosure can provided a number of technical effects and benefits. For instance, a plasma strip process can allow for the directional removal of a top portion of the crust. Removal of the top portion of the crust followed by wet strip of the bulk photoresist can lead to reduced oxidation. Removal of the top portion of the crust prior to wet strip can also allow for a less aggressive chemistry during the wet strip process, leading to reduced defects.

In some embodiments, the above-mentioned technical effects and benefits can be provided by a process that can include placing a substrate having a bulk photoresist and a crust formed on the bulk photoresist (e.g., during ion implantation) in a processing chamber. The process can include initiating a first strip process in the processing chamber. The process can include accessing an optical emission signal associated with a plasma during the first strip process. The process can include identifying an endpoint associated with removal of at least a portion of the crust based at least in part on the optical emission signal. The process can include terminating the first strip process based at least in part on the endpoint. The process can include initiating a second strip process to remove the photoresist from the substrate. In some embodiments, the process can include performing subsequent treatment process(es) (e.g., an anneal process) following the second strip process.

In some embodiments, the first strip process can be operable to remove at least a portion of the crust from the bulk photoresist. The second strip process can be operable to remove at least a portion of the bulk photoresist. The first strip process can be a plasma strip process that exposes the substrate to a plasma induced in the processing chamber. The second strip process can be a wet strip process.

In some embodiments, the optical emission signal (e.g., an optical emission signal associated with one or more wavelengths in the range of about 300 nm to about 800 nm, such as about 309 nm, such as about 777 nm) can include a high emission phase followed by a drop to a low emission phase. The high emission phase can be associated with higher optical emission relative to the low emission phase.

In some embodiments, the endpoint can correspond to a point in the optical emission signal indicative of removal of the crust. For instance, the endpoint can correspond to a point that is within a threshold of a local minimum following the drop in the optical emission signal from the high emission phase.

In some embodiments, the endpoint can correspond to a point in the optical emission signal indicative of removal of a top portion of the crust. For instance, the endpoint can correspond to a point that is within a threshold of a local minimum occurring during the high emission phase of the optical emission signal.

Aspects of the present disclosure are discussed with reference to a "substrate" or "wafer" for purposes of illustration and discussion. Those of ordinary skill in the art, using the disclosures provided herein, will understand that the example aspects of the present disclosure can be used in association with any semiconductor substrate, workpiece, or other suitable substrate. In addition, the use of the term "about" in conjunction with a numerical value is intended to refer to within 10% of the stated numerical value.

Figure 1:
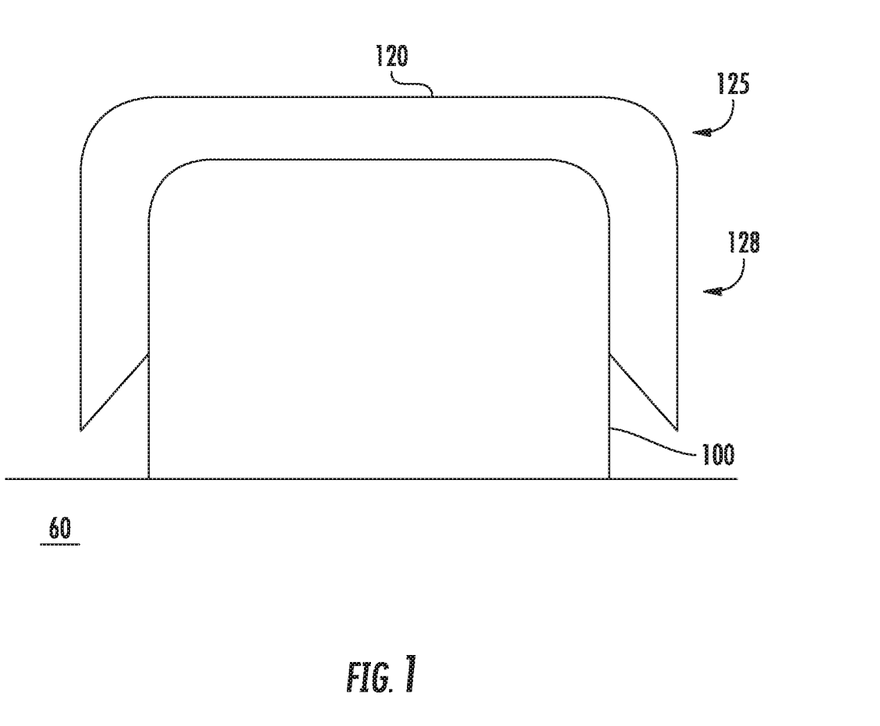
FIG. 1 depicts a cross-section of photoresist after ion implantation showing a crust layer from reaction during ion implantation.

FIG. 1 shows an example photoresist on a substrate 60 (e.g., on one or more layers on a substrate) after ion implantation. More particularly, after ion implantation, there is a formation of a "crust" 120 around the top and on the side portion of the photoresist 100 (e.g., "bulk" photoresist) from the reaction of the photoresist 100 with the implant species. The crust 120 can include a top portion 125 formed on the top of the bulk photoresist 100 and a side portion 128 formed on the side of the bulk photoresist 100. The top portion 125 of the crust 120 can be the thickest with the thickness of the side portion 128 of the crust 120 tapering down at the bottom.

Figure 2:
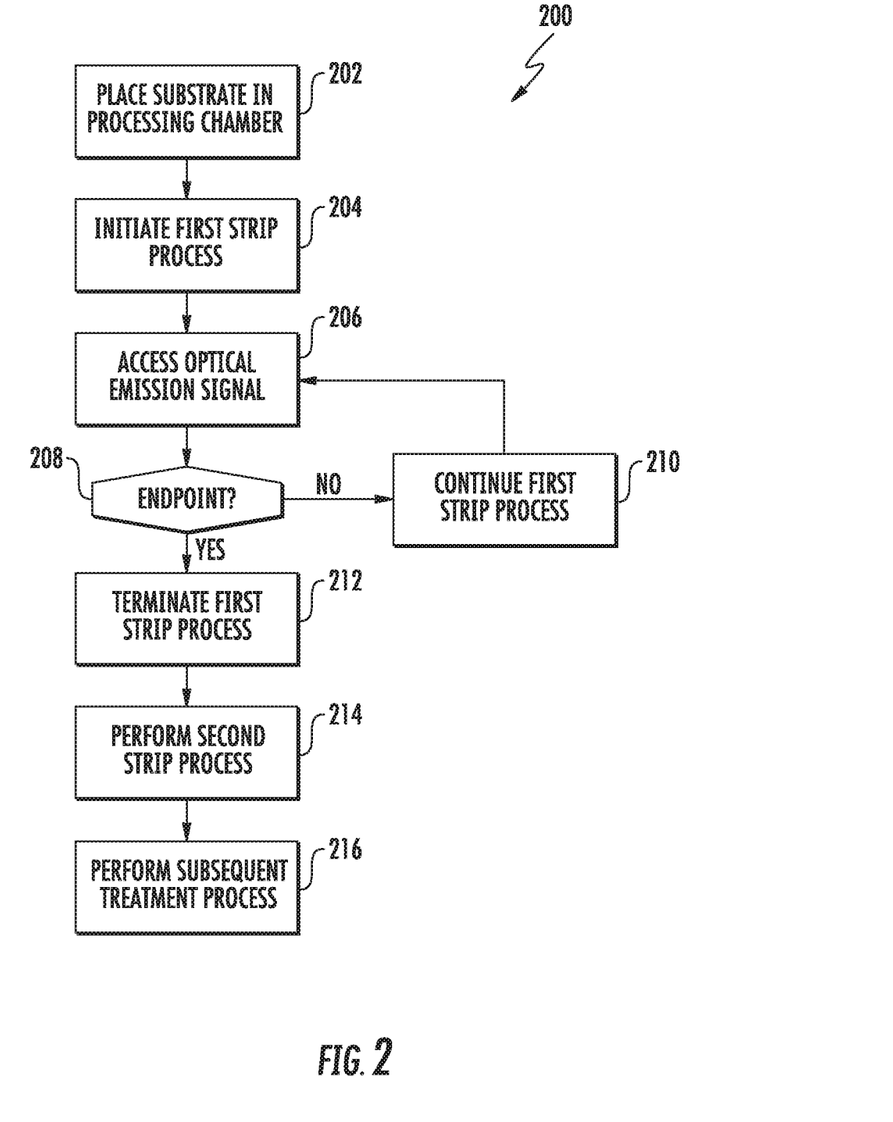
FIG. 2 depicts a flow diagram of an example method according to example embodiments of the present disclosure.

FIG. 2 depicts a flow diagram of an example strip process (200) for removing photoresist (e.g., the bulk photoresist and crust) according to example embodiments of the present disclosure. FIG. 2 can be implanted at least in part using a plasma processing apparatus, such as the plasma processing apparatus depicted in FIG. 5. In addition, FIG. 2 depicts steps performed in a particular order for purposes of illustration and discussion. Those of ordinary skill in the art, using the disclosures provided herein, will understand that various steps of any of the methods or processes disclosed herein can be adapted, modified, rearranged, performed simultaneously, omitted, and/or expanded in various ways (e.g., to include multiple sub-steps) without deviating from the scope of the present disclosure.

Figure 5:
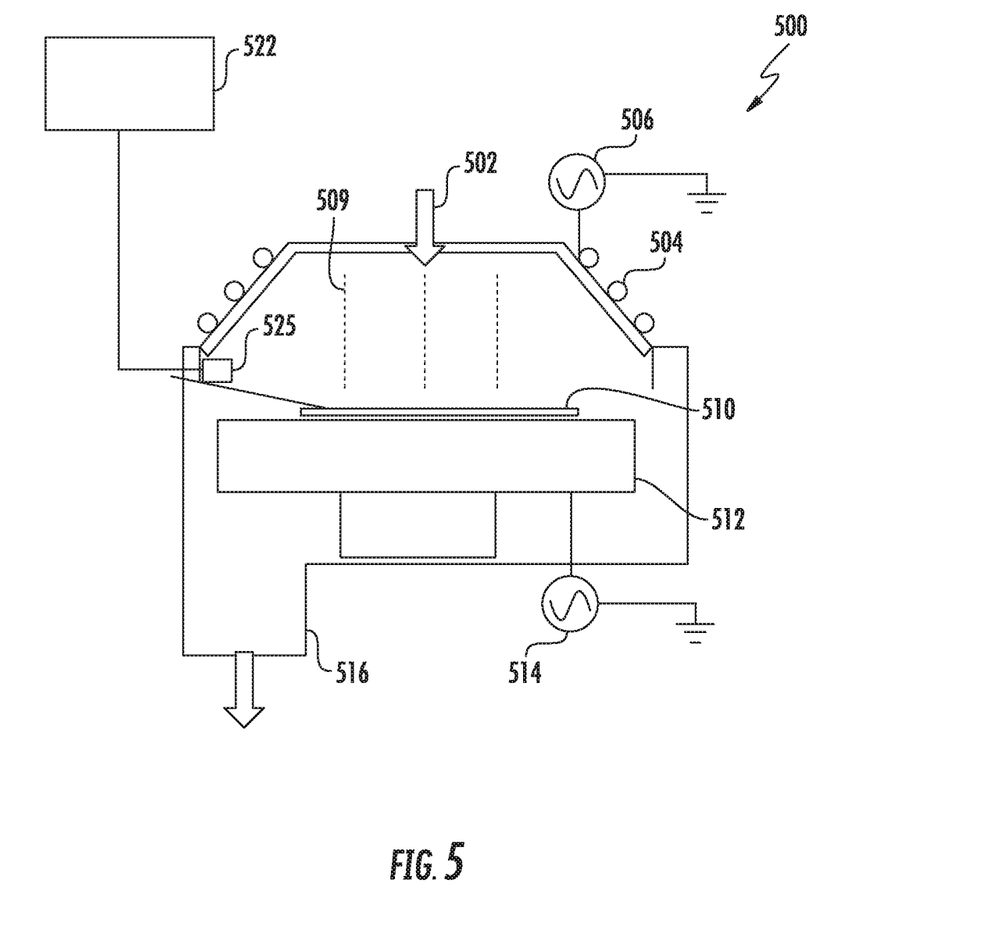
FIG. 5 depicts an example processing apparatus according to example embodiments of the present disclosure.

At (202), the process can include placing a substrate in a processing chamber, such as a plasma processing chamber. The substrate can include a crust formed on a bulk photoresist as a result of ion implantation as discussed above. An example substrate is illustrated in FIG. 1. In some embodiments, the processing chamber can include a inductive plasma source configured to induce an inductive plasma in a process gas in the process chamber. The inductive plasma can generate radicals and neutrals for removal of the crust from the substrate. An example processing chamber is illustrated in FIG. 5.

Referring to FIG. 2 at (204), the process can include initiating a first strip process, such as a plasma strip process, in the processing chamber. An example plasma strip process can use an inductive plasma source to induce a plasma in a process gas to generate radicals and neutrals. The radicals and neutrals can be used to strip the crust from the bulk resist according to example embodiments of the present disclosure. In some embodiments, the plasma strip process can be performed with an aggressive chemistry using the addition of, for instance, $CF_4$.

Example process parameters for a plasma strip process are below:
Temperature: about 20° C. to about 80° C., such as about 25° C.;
Pressure: about 15 mT to about 100 mT, such as about 40 mT;
RF Power: about 300 W to about 2000 W, such as about 1500 W;
$O_2$ Flow: about 500 sccm to about 3000 sccm;
$CF_4$ Flow: about 0% to about 2%, such as 0-20 sccm.

The above process parameters are provided for example purposes only. Those of ordinary skill in the art, using the disclosures provided herein, will understand that in some embodiments, different process parameters can be used for the plasma strip process without deviating from the scope of the present disclosure.

At (206), the method can include accessing an optical emission signal associated with a plasma for the plasma strip process. The optical emission signal can be, for instance, indicative of the spectral power of one or more wavelengths of electromagnetic radiation emitted from the plasma over time. The optical emission signal can be obtained from a variety of sources. In some embodiments, the optical emission signal can be measured in real time during processing. In some embodiments, the optical emission signal can be based on data (e.g., historical data) associated with the previous processing of substrates or test substrates.

For instance, optical emission signals for various strip process can be obtained during processing of test substrates. The optical emission signals can be analyzed and used to determine a model optical emission spectrum for the strip process. The model optical emission spectrum can be determined in a variety of ways (e.g., using an average, weighted average, or other algorithm). The model optical emission spectrum can be used as the optical emission signal for identifying an endpoint according to example embodiments of the present disclosure.

Figure 3:
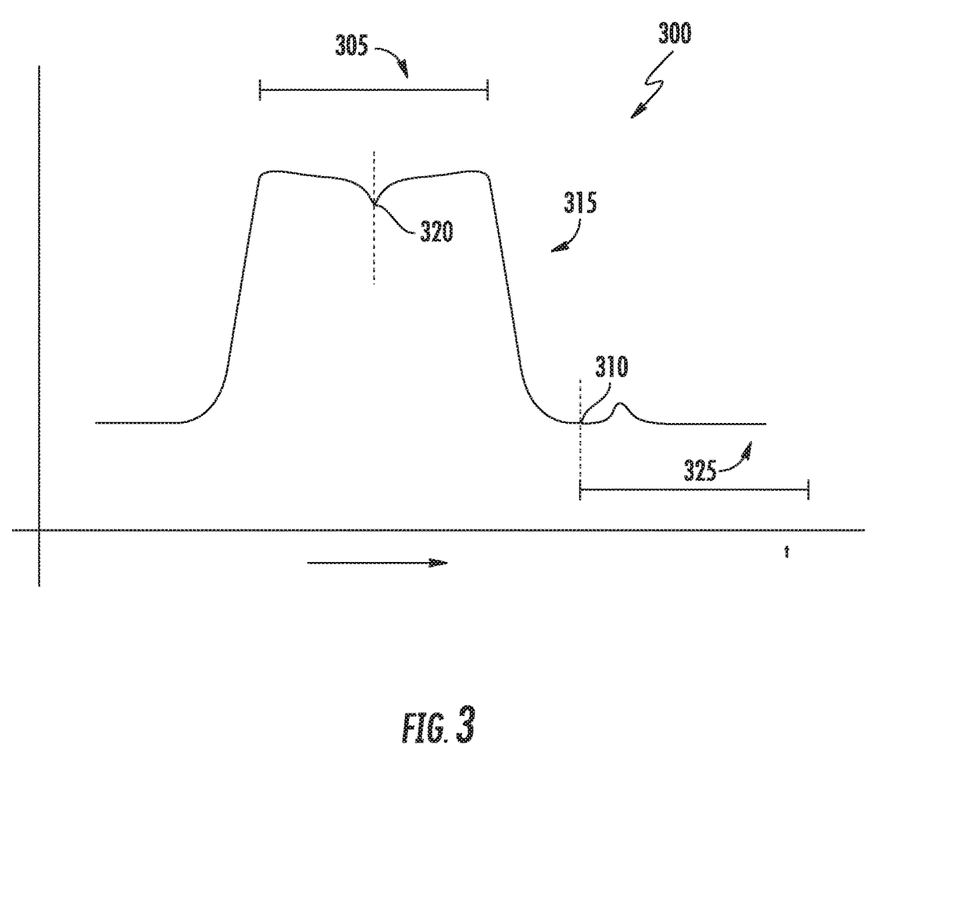
FIG. 3 depicts an example optical emission signal having an endpoint indicative of crust removal.

FIG. 3 depicts a graphical representation of an optical emission signal 300 associated with a plasma during processing according to example embodiments of the present disclosure. The graphical representation of FIG. 3 plots time on the horizontal axis and spectral power along the vertical axis. The optical emission signal 300 can be associated with one or more wavelengths in the range of about 300 nm to about 800 mm, such as about 309 nm, such as about 777 nm. As shown in FIG. 3, the optical emission signal 300 can include a high emission phase 305 followed by a drop 315 to a low emission phase 325. The high emission phase 305 can be associated with a higher emission relative to the low emission phase 325.

Referring to FIG. 2 at (208), the process (200) can determine whether an endpoint has been reached based on the optical emission signal. In some embodiments, the endpoint can correspond to an point in the optical emission signal indicative of removal of the crust from the bulk photoresist. For instance, referring to FIG. 3, a point 310 within a threshold of a local minimum (e.g., a dip) in the optical emission signal 300 following the drop 315 from the high emission phase 305 can be indicative of removal of the crust from the bulk photoresist.

In some embodiments, the endpoint can be determined in real time by analyzing a measured optical emission signal associated with a plasma during the plasma strip process. When a point in the optical emission signal that is within a threshold of a local minimum following a drop from a high emission phase is reached (e.g., point 310 in FIG. 3), a controller or other control device can determine that an endpoint has been reached.

In some embodiments, the endpoint can be determined by analyzing an optical emission signal associated with historical data or test data (e.g., a model optical emission signal) for the particular plasma strip process being performed. A time following initiation of the strip process corresponding to a point that is within a threshold of a local minimum following a drop from a high emission phase in the optical emission signal can be identified (e.g., about 22.6 seconds). The endpoint can be determined to correspond with the identified time.

In some embodiments, the endpoint can correspond to an point in the optical emission signal indicative of removal of only the top portion of the crust from the bulk photoresist. For instance, referring to FIG. 3, the present inventors have discovered that a point 320 within a threshold of a local minimum (e.g., a dip) in the optical emission signal 300 during the high emission phase 305 can be indicative of removal of only the top portion of the crust from the bulk photoresist.

In some embodiments, the endpoint can be determined in real time by analyzing a measured optical emission signal associated with a plasma during the plasma strip process. When a point in the optical emission signal that is within a threshold of a local minimum during a high emission phase is reached (e.g., point 320 in FIG. 3), a controller or other control device can determine that an endpoint has been reached.

In some embodiments, the endpoint can be determined by analyzing an optical emission signal associated with historical data or test data (e.g., a model optical emission signal) for the particular plasma strip process being performed. A time following initiation of the strip process corresponding to a point that is within a threshold of a local minimum a high emission phase in the optical emission signal can be identified (e.g., about 15.8 seconds). The endpoint can be determined to correspond with the identified time.

Figure 4:
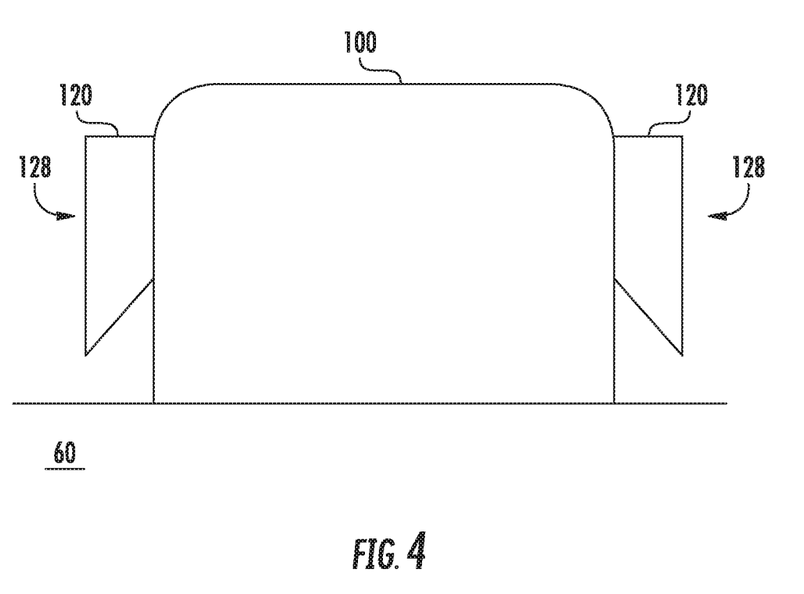
FIG. 4 depicts an example cross-section showing a top portion of the crust layer removed from the top of the photoresist according to example embodiments of the present disclosure.

FIG. 4 depicts an example photoresist after an endpoint has been determined for the plasma strip process. As shown, a top portion of the crust 120 has been removed during the plasma strip process. A side portion 128 of the crust 120 formed on the side of the bulk photoresist 100 can remain at the endpoint of the first strip process determined according to example aspects of the present disclosure.

Referring to FIG. 2 at (208), if an endpoint is not determined to be reached, the process moves to (210) where the plasma process continues with the first strip process until it is determined that an endpoint is reached. If an endpoint is determined to be reached, the process proceeds to (212) where the first strip process is terminated.

At (214), the process includes performing a second strip process to remove the bulk of the photoresist. In some embodiments, the second strip process can be a wet strip process. The wet strip process can make use of, for instance, a wet chemical bath. Because at least a portion of the crust is removed prior to the wet strip process, a less aggressive chemistry can be used for the wet strip process. For instance, in some embodiments, the wet strip process can a bath including hydrogen peroxide and ammonium hydroxide.

At (216), the process can include performing subsequent treatment steps on the substrate. As one example, an annealing process can be performed to activate dopants in the substrate. Other subsequent treatment steps can be performed in accordance with integrated circuit manufacturing techniques without deviating from the scope of the present disclosure.

FIG. 5 depicts an example plasma processing apparatus 500 that can be used to carry out the plasma strip processes forming a part of the photoresist removal process according to example embodiments of the present disclosure. The apparatus 500 can include a gas inlet 502 that can provide gas to a plasma source 504, powered by an RF source 506. A plasma 508 is produced to which a substrate 510 is exposed. The substrate 510 can be supported on a pedestal 512 to which an RF bias 514 can be applied for purposes of accelerating ions in plasma 508. A pump (not shown) is connected to an exhaust channel 516. The processing apparatus 500 is provided for purposes of illustration and discussion. Those of ordinary skill in the art, using the disclosures provided herein, will understand that other processing apparatus can be used to implement aspects of the example processes disclosed herein without deviating from the scope of the present disclosure.

In some embodiments, as shown in FIG. 5, the apparatus 500 can include an optical emission sensor 525 configured to obtain an optical emission signal (e.g., the optical emission signal 300 of FIG. 3) associated with the substrate 510. The optical emission sensor 525 can be, for instance, an optical spectrometer.

The optical emission signal can be provided to one or more controller(s) 522. The controller(s) 522 can control termination of a strip process based on an endpoint identified from the optical emission signal according to example embodiments of the present disclosure. The controller(s) can be stand alone controller(s) or part of an overall control system for the apparatus. In some embodiments, the controller(s) can include one or more processors and one or more memory devices. The one or more memory devices can store computer-readable instructions that when executed cause the processors to perform operations, such as determination of an endpoint according to example embodiments of the present disclosure. The controller(s) 522 can be located with the apparatus 500 or remote from the apparatus 500. The optical emission signal can be communicated from the sensor 525 over any suitable communication medium (e.g., a wired, wireless or combination of wired and wireless communication mediums) using any suitable communication protocol.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A process for removal of photoresist from a substrate, comprising:
    placing a substrate having a bulk photoresist and a crust formed on the bulk photoresist in a processing chamber;
    initiating a first strip process in the processing chamber;
    accessing an optical emission signal associated with a plasma during the first strip process, wherein the optical emission signal comprises a high emission phase followed by a drop to a low emission phase, the high emission phase associated with higher optical emission relative to the low emission phase;
    identifying an endpoint associated with removal of at least a portion of the crust based at least in part on the optical emission signal, wherein the endpoint corresponds to a point in the optical emission signal indicative of removal of a top portion of the crust, and the point in the optical emission signal indicative of removal of the top portion of the crust is within a threshold of a local minimum occurring during the high emission phase of the optical emission signal;
    terminating the first strip process based at least in part on the endpoint; and
    initiating a second strip process to remove the photoresist from the substrate.

2. The process of claim 1, wherein the first strip process is operable to remove at least a portion of the crust from the bulk photoresist.

3. The process of claim 1, wherein the second strip process is operable to remove at least a portion of the bulk photoresist.

4. The process of claim 2, wherein the first strip process is a plasma strip process that exposes the substrate to a plasma induced in the processing chamber.

5. The process of claim 3, wherein the second strip process is a wet strip process.

6. The process of claim 1, wherein the optical emission signal is associated with a one or more wavelengths in the range of about 300 nm to about 800 nm.

7. The process of claim 1, wherein the endpoint corresponds to a point in the optical emission signal indicative of removal of the crust.

8. The process of claim 7, wherein the point in the optical emission signal indicative of removal of the crust is within a threshold of a local minimum following the drop in the optical emission signal from the high emission phase.

9. The process of claim 1, wherein the process comprises performing a subsequent treatment process following the second strip process.

10. The process of claim 1, wherein a subsequent treatment process after the process for removal of photoresist from the substrate comprises an annealing process.

11. The process of claim 1, wherein the crust is formed during an ion implantation process.

12. A process for removing photoresist from a substrate, comprising:
    placing a substrate having a bulk photoresist and a crust formed on the bulk photoresist layer in a plasma processing chamber;
    initiating a plasma strip process in the plasma processing chamber;
    terminating the plasma strip process at an endpoint corresponding to a point in an optical emission signal indicative of removal of the crust, wherein the optical emission signal comprises a high emission phase followed by a drop to a low emission phase, the high emission phase associated with higher optical emission relative to the low emission phase, the endpoint corresponds to a point in the optical emission signal indicative of removal of a top portion of the crust, and the point in the optical emission signal indicative of removal of the top portion of the crust is within a threshold of a local minimum occurring during the high emission phase of the optical emission signal; and
    after terminating the plasma strip process, initiating a wet strip process to remove the bulk photoresist from the substrate.

13. The process of claim 12, wherein the point in the optical emission signal indicative of removal of the crust is within a threshold of a local minimum following the drop in the optical emission signal from the high emission phase.

14. A strip process for removing photoresist from a substrate, comprising:
    placing a substrate having a bulk photoresist and a crust formed on the bulk photoresist layer in a plasma processing chamber;
    initiating a plasma strip process in the plasma processing chamber;

terminating the plasma strip process at an endpoint corresponding to a point in an optical emission signal indicative of removal of a top portion of the crust, wherein the optical emission signal comprises a high emission phase followed by a drop to a low emission phase, the high emission phase associated with higher optical emission relative to the low emission phase, the endpoint corresponds to a point in the optical emission signal indicative of removal of a top portion of the crust, and the point in the optical emission signal indicative of removal of the top portion of the crust is within a threshold of a local minimum occurring during the high emission phase of the optical emission signal; and after terminating the plasma strip process, initiating a wet strip process to remove the bulk photoresist and remainder of the crust from the substrate.

\* \* \* \* \*